United States Patent
Pruessmann et al.

(10) Patent No.: US 7,208,951 B2
(45) Date of Patent: Apr. 24, 2007

(54) MAGNETIC RESONANCE METHOD

(75) Inventors: Klaas P. Pruessmann, Zürich (CH);
Nicola De Zanche, Zürich (CH)

(73) Assignees: Universitat Zurich Prorektorat Forschung, Zurich (CH); ETH Zurich, ETH Transfer, Zurich (CH)

(*) Notice: Subject to any disclaimer, the term of this patent is extended or adjusted under 35 U.S.C. 154(b) by 0 days.

(21) Appl. No.: 11/095,295

(22) Filed: Mar. 31, 2005

(65) Prior Publication Data

US 2005/0218892 A1 Oct. 6, 2005

(30) Foreign Application Priority Data

Apr. 2, 2004 (EP) .................... 04008142

(51) Int. Cl.
*G01V 3/00* (2006.01)

(52) U.S. Cl. ..................... 324/309; 324/318

(58) Field of Classification Search ........ 324/300–322; 335/216, 296; 600/410
See application file for complete search history.

(56) References Cited

U.S. PATENT DOCUMENTS

| | | | |
|---|---|---|---|
| 4,623,843 A | | 11/1986 | Macovski |
| 4,631,480 A | | 12/1986 | Young |
| 5,315,249 A | * | 5/1994 | Le Roux et al. ............ 324/309 |
| 5,631,561 A | * | 5/1997 | Stetter ..................... 324/322 |
| 5,731,704 A | * | 3/1998 | Schnur et al. ............. 324/320 |
| 5,752,513 A | * | 5/1998 | Acker et al. ............... 600/424 |
| 5,945,826 A | * | 8/1999 | Leussler .................... 324/309 |
| 6,933,720 B2 | * | 8/2005 | Zhang ....................... 324/309 |

FOREIGN PATENT DOCUMENTS

| | | |
|---|---|---|
| DE | 11 44 398 B | 2/1963 |
| EP | 0 272 111 A2 | 6/1998 |
| EP | 1 178 327 A2 | 2/2002 |
| EP | 1 209 480 A2 | 5/2002 |
| JP | 02 297337 A2 | 12/1990 |

* cited by examiner

*Primary Examiner*—Brij B. Shrivastav
(74) *Attorney, Agent, or Firm*—McCormick, Paulding & Huber LLP

(57) ABSTRACT

A novel magnetic resonance (MR) imaging or spectroscopy method is presented, in which a main magnetic field is generated in an object by a main magnet and superimposed magnetic fields and adiofrequency fields are generated according to an MR sequence for forming images or spectra. Object signals are acquired from the object with at least one object detector during execution of the MR sequence. Further, additional data are acquired from at least one monitoring field probe positioned in the vicinity of and surrounding the object, during execution of the MR sequence. The additional data from the monitoring field probes are used for adjusting the MR sequence such as to correct for imperfections in the field response of the object detectors, and the additional data from the monitoring field probes are used in conjunction with the object signals for reconstruction of the images or spectra.

27 Claims, 3 Drawing Sheets

Figure 5:
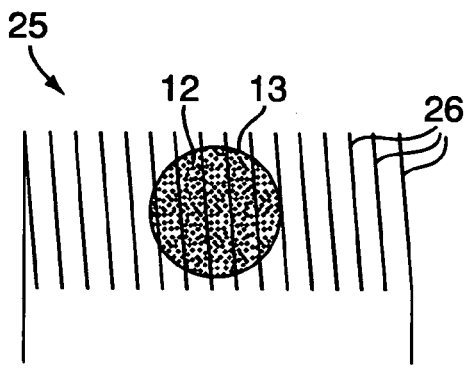

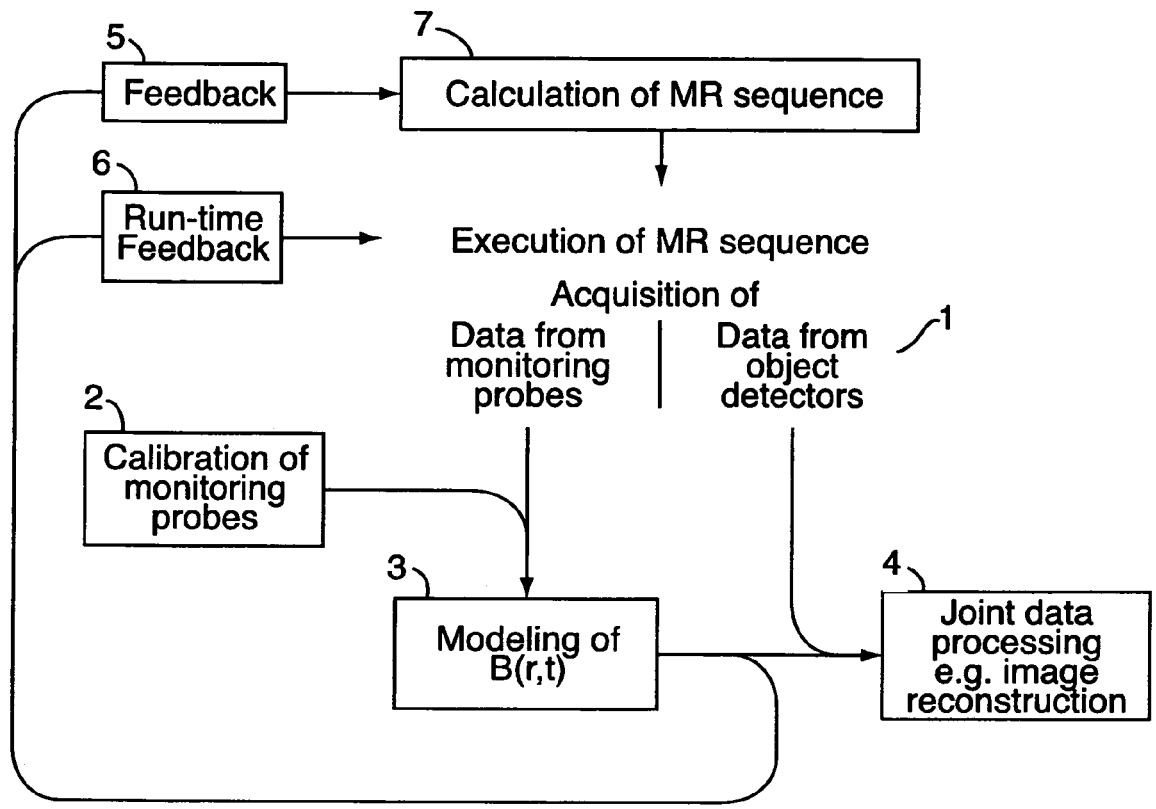
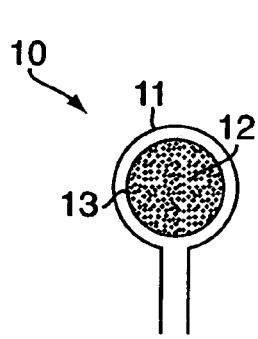
FIG. 2
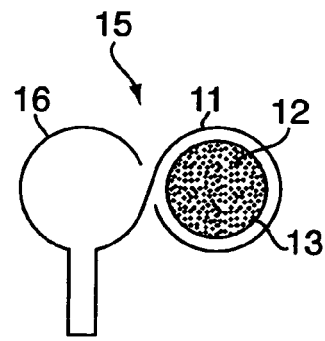
FIG. 3
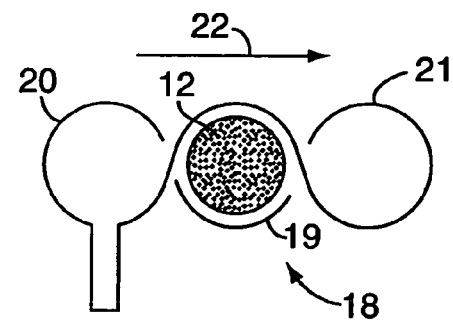
FIG. 4

MAGNETIC RESONANCE METHOD

PRIORITY CLAIM

Applicant hereby claims foreign priority under 35 U.S.C § 119 from European Application No. 04008142.4 filed 02 Apr. 2004, the disclosure of which is herein incorporated by reference.

FIELD OF THE INVENTION

The invention relates to a magnetic resonance method for forming images or spectra from magnetic resonance signals acquired from an object by at least one object detector. The invention also relates to a magnetic resonance imaging apparatus for obtaining images or spectra and to a computer program product for forming a dynamic image by means of a magnetic resonance method.

BACKGROUND OF THE INVENTION

In magnetic resonance imaging and spectroscopy, magnetic fields are used to manipulate nuclear magnetic resonance signals. Typically, time-varying magnetic gradient fields in multiple directions are superimposed to a constant, homogeneous main magnetic field to create spatial phase modulations in the magnetization of the object under examination. The homogeneous field is usually generated by a resistive or superconductive electromagnet. The gradient fields are usually generated by applying specifically shaped current waveforms to a multiple of gradient coils.

For accurate MR imaging or spectroscopy it is important that the main magnetic field and the gradient fields follow precisely the desired spatial and temporal patterns. However, in practice electromagnetic coupling among the various coils as well as between the coils and other components of the apparatus distorts the ideal field patterns and time courses. Timing imperfections in control electronics have similar effects. Spatial and temporal variations of the magnetic field can also arise from temperature changes in the apparatus, which frequently occur during operation. Another source of field variation is the magnetic susceptibility of the subject or object under examination. It causes added field contributions, which can vary over time, e.g. due to physiological motion like breathing. MR images and spectra acquired in the presence of such field deviations typical exhibit errors, distortions, artifacts, or signal losses.

For instance in U.S. Pat. No. 6,294,916 a magnetic resonance imaging apparatus is described, which uses magnetic field gradients X, Y, Z to spatially encode the magnetic resonance signals arising from a patient on a couch in the bore of a main magnet. Thermal stresses arising from aggressive gradients during multiple acquisitions result in imperfectly repeated gradients and resulting image artefacts. A probe comprising an MR active substance is used, equipped with a gradient coil set similar to that for imaging, and is fed by currents derived from the imaging gradient coils, connected so as to produce an opposing gradient surrounding an MR active substance in the probe. The probe produces a signal to be used to monitor the gradient, while overcoming de-phasing in the active substance.

The construction of the probe with the additional gradient coils of above mentioned apparatus is quite complicated and technically difficult to realize. The additional gradient coils will generate magnetic fields also outside the probe and couple with any magnetic or inductive structural elements of the apparatus. As a consequence, the additional gradient coils are likely to interfere with the actual experiment as well as with potential further probes. Moreover, coupling to the main gradient coils will cause error currents in the additional gradient coils, hence limiting the ability to prevent dephasing.

SUMMARY OF THE INVENTION

The main aspect of the present invention is based on monitoring the effective magnetic field as a function of space and time during execution of an MR sequence. The monitoring signals are obtained from small field probes distributed around the object under examination. Based on the monitoring information, the reconstruction of MR images or spectra can be significantly enhanced. In a more advanced control system, monitoring is also used to adjust the MR sequence such as to correct for imperfections in the field response. This can be done either based on the monitoring results of a previous run or by immediate feedback in a run-time mode. In this mode, the monitoring information is used to continuously correct a sequence while it is being executed.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

Figure 6:
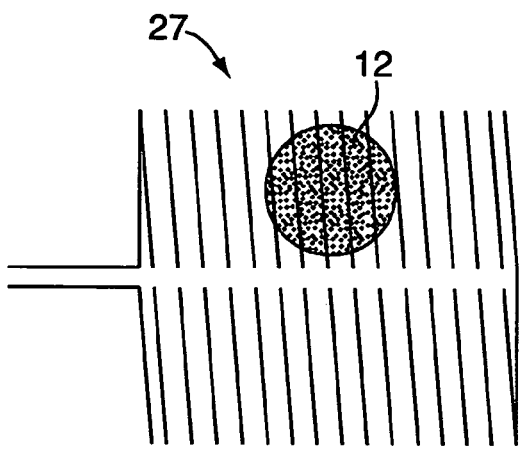
Figure 7:
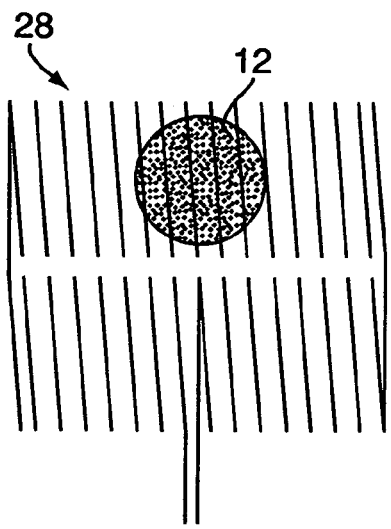
Figure 8:
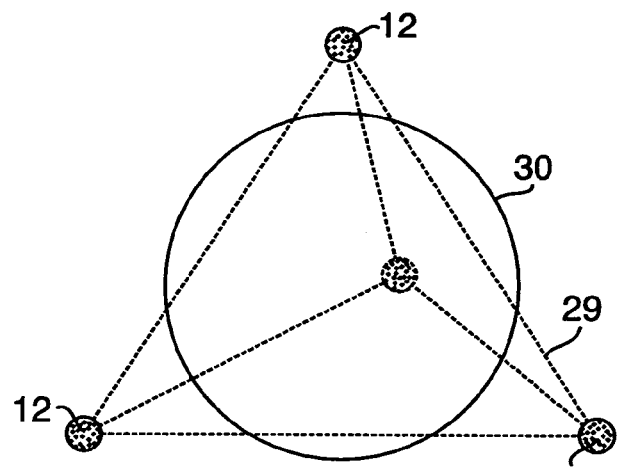
Figure 9:
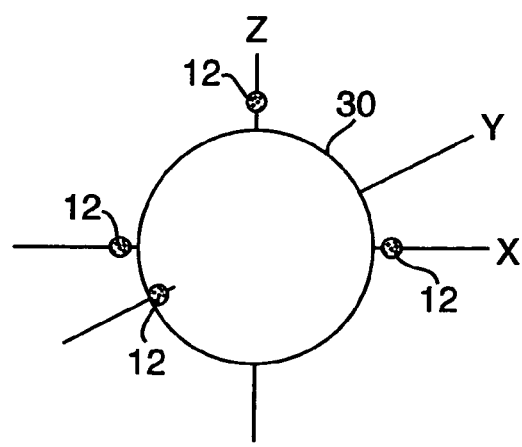
Figure 10:
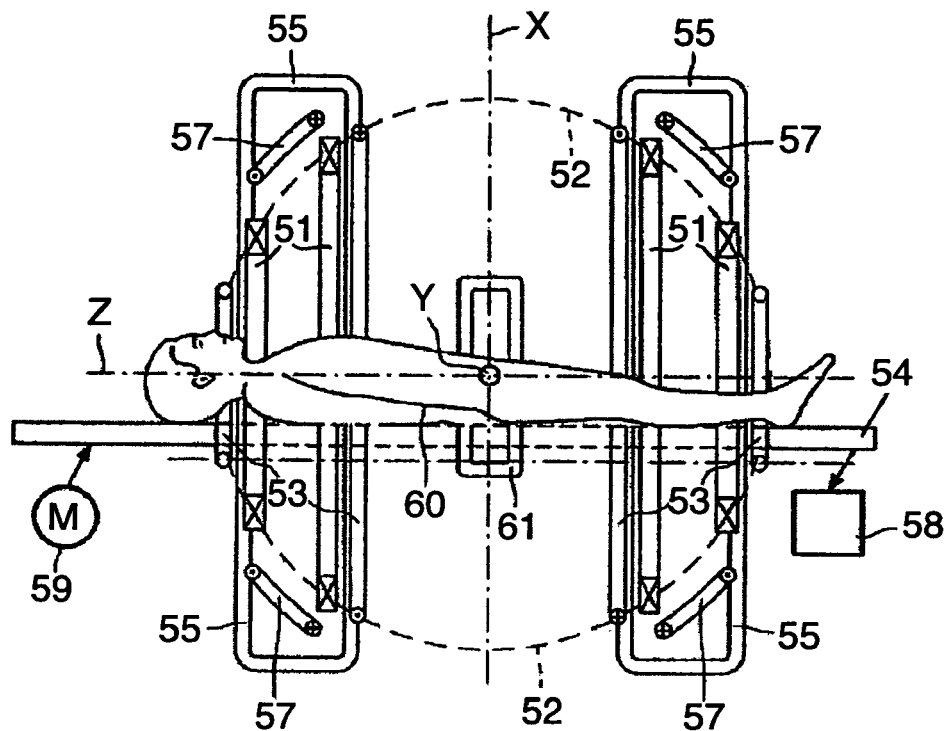
Figure 11:
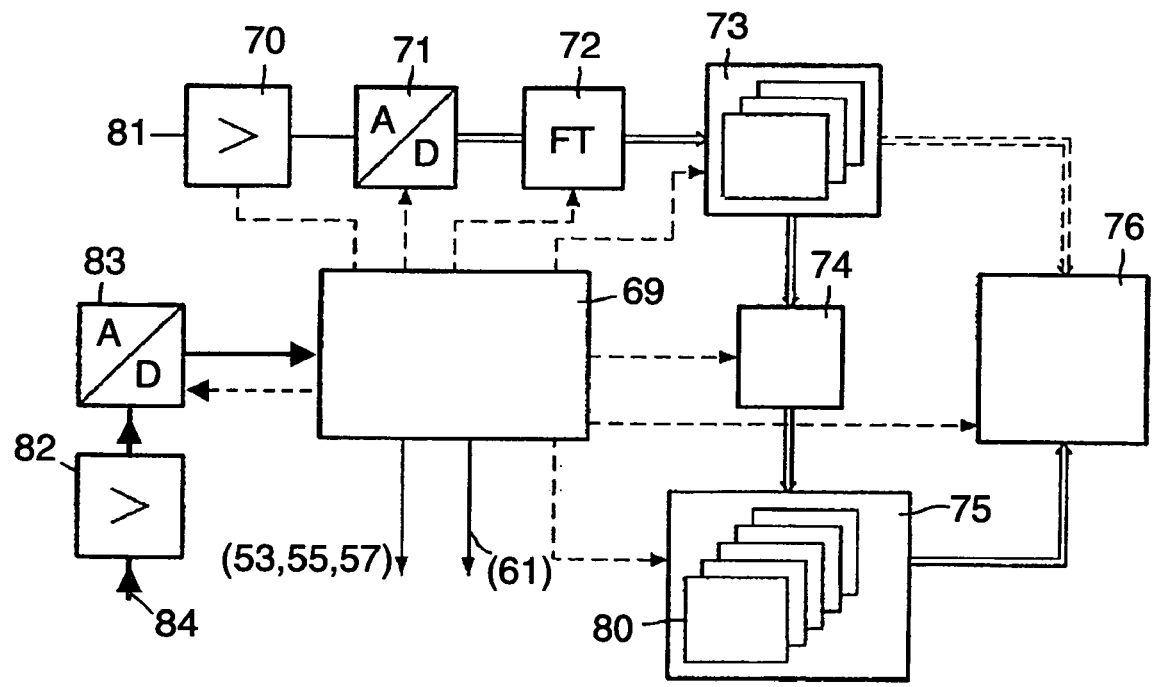

FIG. 1 is a flow diagram of the procedural steps of the monitoring and correction method, FIGS. 2 to 4 show basic designs of a loop coil for use in MR probes, FIGS. 5 to 7 show designs of a solenoid coil for use in MR probes, FIG. 8 shows a first example of positioning monitoring probes, FIG. 9 shows a second example of positioning monitoring probes, FIG. 10 shows an MR apparatus for performing the monitoring and correction method, and FIG. 11 shows a control unit for data processing and image reconstruction.

DETAILED DESCRIPTION OF THE PREFERRED EMBODIMENTS

Methodological Considerations

According to the present invention one or more field probes are positioned in the near vicinity of the object under examination for monitoring the main magnetic field during an MR imaging or spectroscopy experiment. As depicted in the flow diagram of FIG. 1, in step 1 time series of MR data are acquired from the object to be examined, using the detectors, which are sensitive to magnetic resonance in the object ('object detectors'). Typically, the object detectors are tuned receiver coils as commonly used for MR detection. The data acquisition is part of a sequence ("MR sequence") of operations performed with the MR apparatus. This sequence is calculated beforehand (step 7) and includes the control signals for gradient coils and acquisition systems. The data acquired in step 1 are processed in step 4. The processing typically serves for generating images or MR spectra of the examined object. In the present method, additional data are acquired from the monitoring field probes in step 1. Such monitoring data are acquired throughout the relevant parts of the MR sequence, typically including the intervals of data acquisition from the object with the main receivers as well as other intervals during which the object's magnetization evolves. Hence, data acquisition from object detectors and monitoring field probes is partly simultaneous but essentially independent. Together with separately obtained calibration data of the monitoring probes (step 2), the monitoring data are preferably used for calculating a model of the spatial and temporal behavior of the magnetic field during the experiment (step 3). This model of the magnetic field B(r,t) is then used for supporting the processing of the data obtained from the object detectors (step 4). The model B(r,t) can also be used for feedback adjustment of the MR sequence. Sequence adjustment encompasses changes to any elements of the MR sequence. The sequence elements include nominal gradient time courses, transmit RF waveforms, data acquisition schemes, as well as time courses for dynamic shim modules when available. In a basic implementation of sequence feedback, the model information is used for recalculating the entire MR sequence (step 7) for a subsequent run of the experiment. Alternatively or in addition, B(r,t) is fed back continuously during the execution of the monitored MR sequence for immediate, so-called run-time correction (step 6). The model B(r,t) generally facilitates interpreting the monitoring results. However, enhanced data processing and sequence feedback may as well be based directly on the raw monitoring data.

In modeling B(r,t), the number of probes limits the spatial model order. For instance, four probes permit fitting a basic model with the basis functions $\alpha_1(r)=1$, $\alpha_2(r)=x$, $\alpha_3(r)=y$, $\alpha_4(r)=z$, where $r=(x, y, z)^T$ denotes the position in 3D space. This model is sufficient for representing any superposition of fields that are homogeneous or linear in space. With such a setup, common linear coupling among the main field coil and the gradient coils, as well as timing imperfection in the gradient channels can be captured. For capturing effects of higher order in space, e.g. due to coupling between gradient coils and other inductive structures, more probes are required. E.g., eight probes permit fitting the extended basis $\alpha_1(r)=1$, $\alpha_2(r)=x$, $\alpha_3(r)=y$, $\alpha_4(r)=z$, $\alpha_5(r)=xy$, $\alpha_6(r)=xz$, $\alpha_7(r)=yz$, $\alpha_8(r)=xyz$.

Basic requirements for the monitoring field probes are the following. They must measure local small changes (typically<1 µT) in a high background field (typically 0.1 to 20 T) with high accuracy and temporal fidelity. The required temporal resolution depends on the speed of the field manipulations to monitor. Frequently, the sampling rate used for acquiring data from the main receivers is sufficient also for field monitoring. The probes should be completely or almost non-magnetic and should not interfere with the actual MR experiment.

The number and the positioning of the probes determine the range of spatial field variations that can be captured. When a mathematical model is used for representing the magnetic field behavior, it is important that the set of probes permit a robust fit of the model coefficients. The fit is generally more reliable when the probes are placed close to the object. For instance, for monitoring MRI in a human head the distance of the probes from the head should preferably be in the range of up to 5 cm. When possible, probes may also be placed in cavities for more accurate field mapping. For instance, in human head imaging monitoring probes may be placed in the oral cavity or in the auditory canals. For the previously mentioned simple model $\alpha_1(r)=1$, $\alpha_2(r)=x$, $\alpha_3(r)=y$, $\alpha_4(r)=z$, four probes are sufficient. A suitable arrangement of four probes is shown in FIG. 8, in which the probe samples 12 are positioned on the vertices of a tetrahedron 29 around the object 30 under examination. Another arrangement is shown in FIG. 9, where two probe samples 12 are placed on the X axis (one on either side of the object 30) and two further probe samples are positioned on the Y and Z axes (one on each). For more probes and more sophisticated models the best arrangement depends on the specific object and model. A near-isotropic distribution of the probes around the object is generally appropriate.

For the correct interpretation of raw monitoring data, the positions of the individual probes must be known. The positions are preferably assessed by short calibration procedures (step 2 in FIG. 1), which typically precedes the actual experiment. The probe positions are described by the vectors $r_p=(x_p, y_p, z_p)^T$, where p is an index counting the probes. It is important that the probes do not change their positions between position assessment and monitoring. Therefore they should preferably be mounted on a rigid frame. Further calibration steps are specific to the different probe mechanisms.

MR Monitoring Probes

Exploiting the presence of the main field, the field probes can be based upon magnetic resonance in a small sample volume of an MR-active substance. After MR excitation of the sample, the frequency of the resonance signal is proportional to the magnitude of the local magnetic field.

In a first embodiment of the present invention, MR probes are provided. The individual sample volume is chosen small in order to probe the field at a well-defined position and to prevent signal dephasing due to field inhomogeneity inside the sample. For monitoring MRI sequences, the sample size is typically 0.5 to 2 mm in diameter. For MRI the sample should preferably not be larger than the imaging resolution, i.e. the voxel size, in order to prevent dephasing by the imaging gradients. In principle, the sample and the sample container can have any shape. Preferably the sample should be spherical or approximately spherical. Spherical samples have two advantages: firstly, they are isotropic and hence exhibit the same susceptibility to gradient dephasing in all dimensions, and secondly, the magnetic permeability of the probe substance will typically deviate somewhat from that of the ambient medium. Therefore the probe causes a local deviation of the magnetic field strength. Inside a spherical probe the added field component is homogeneous, thus preventing additional signal dephasing.

MR in the probe samples can be based either on the same nucleus as used in the actual MR experiment or on another nucleus. MR spectroscopy is done on many different nuclei, e.g. $^1H$, $^{13}C$, $^{17}O$, $^{19}F$, $^{31}P$. MRI is mostly based on $^1H$. The choice of the nucleus for probing is subject to several considerations. On the one hand, it is technically easier to use the same nucleus as in the actual experiment. In this case the object under examination in the actual experiment and the probes use the same range of resonance frequency and can rely on the same RF hardware. On the other hand, it is important to prevent signal contamination of the probes by interaction with the examined object and object detectors. This can be achieved very effectively by choosing a different nucleus and hence a different range of resonance frequency. Furthermore, the nucleus used for the probe substances should preferably exhibit a high gyromagnetic ratio in order to yield strong probe signals. In this respect, $^1H$ and $^{19}F$ are preferable choices.

Based on the chosen nucleus, the choice of the probe substance is again subject to several considerations. It should contain the chosen nucleus in high density, so as to yield strong probe signals. It should have a sufficiently long T2 relaxation time for permitting continuous monitoring during the required intervals (typically 1 to 200 ms). It should preferably have a short T1 relaxation time for recovering sufficient magnetization between monitoring intervals. Typically, these requirements can only be met with liquids. The substance should have nearly the same magnetic permeability as the ambient medium in order not to interfere with the actual MR experiment. Usually, the probes are operated in air. Then the sample substance should exhibit nearly unit relative magnetic permeability, $\mu_r \approx 1$. Its MR spectrum should preferably exhibit only one resonance line or few resonance lines of similar frequency. Given these requirements, water is a preferred probe substance based on $^1$H. Suitable substances based on $^{19}$F include hexafluorobenzene and trifluoromethylsulfonate. For adjusting the relaxation times, relaxation agents, e.g. Gadolinium compounds, may be used.

The choice of the containers for the sample substance is subject to several considerations. The container material should be virtually non-magnetic and non-conductive; it should be chemically and physically stable in contact with the sample substance; it should be not or only minimally permeable to the sample substance. Generally, a preferred material is glass with negligible metal impurities. For some sample substances, plastics like Perspex or PVC are also suitable materials. Simple glass-based containers can be made from capillary tubes. For forming spherical samples, glass can be blown into a spherical shape. Based on a plastic, a spherical container can be formed by putting together two hollow half-spheres, which may be formed by milling.

The resonance signal from each MR sample is preferably detected in the same way as usually done in MRI, i.e. by induction in a receive coil. For high sensitivity and signal power output, the coil should be complemented by tuning and matching circuitry, as typically done in MR detectors. For optimizing the signal-to-noise ratio of the monitoring signal, a pre-amplification stage close to the coil may be included. The geometric design of the coil itself is subject to several considerations.

A probe coil should be highly sensitive to its respective sample, yet insensitive to radio frequency fields originating from other monitoring samples and coils or from the examined object and object detectors. High sensitivity to the sample is achieved by a coil structure that neighbours or surrounds the sample very closely. A preferable choice is a loop or solenoid structure, surrounding the sample with one or multiple windings. For reducing the coil's sensitivity to outer signals, one can exploit the fact that magnetic flux generated by more distant sources varies smoothly across the coil's size. Signal contributions from such flux components can be suppressed with suitably wound, self-canceling coil structures.

Typical coil designs are shown in FIGS. 2 to 7. A basic coil 10 with a single loop 11 surrounding the MR sample substance 12 in a container 13 is shown in FIG. 2. A simple implementation of a self-canceling coil 15 with an additional loop 16 having an opposed winding sense, which is electrically connected to the single loop 11 is shown in FIG. 3. The additional loop 16 cancels signal induction by magnetic flux components that are constant in space. As a result the coil 15 couples much less to other monitoring samples and coils, to the object of the actual experiment, to the object detectors and/or to other structures of the MR apparatus. A more advanced version of a self-canceling coil is shown in FIG. 4, in which a coil 18 is shown. The sample 12 is placed in a double-loop 19, which is bracketed by two single loops 20 and 21 of opposite sense. The two additional loops 20 and 21 cancel flux that is constant in space as well as flux that changes linearly in the direction indicated by the arrow 22.

In FIG. 5 a solenoid coil 25 with multiple cylindrical windings 26 is depicted, which achieves a higher sensitivity than the single loop coil 10. The principle of self-canceling translates directly to solenoid coils. In FIG. 6 a self-canceling solenoid coil 27 similar to the single loop coil 15 of FIG. 3, and in FIG. 7 another self-canceling solenoid coil 28, also similar to the single loop coil 15, are shown. Self-canceling coils of higher order can be constructed by adding more canceling loops and choosing the individual number and sense of windings such as to also cancel flux components of higher order in space. A further self-canceling coil design is a toroid coil (not depicted). For best signal yield, MR probe coils should be oriented such that the polar axes of the loops closest to the sample are perpendicular to the main magnetic field. In FIGS. 2, 3, 4 the polar axes are perpendicular to the picture plane. In FIGS. 5, 6, 7 the polar axes are horizontal.

For generating monitoring signals in rapid succession, it can be useful to actively dephase or relax the remaining transverse magnetization in a probe sample. This operation, which may be referred to as a 'reset' of the sample, serves for preventing signal interference with subsequent monitoring signals. For instance, a reset can be accomplished with small individual switchable gradient coils surrounding the sample, which briefly create a strongly inhomogeneous magnetic field across the sample for rapid dephasing.

Besides MR probes, other mechanisms may be used for magnetic field probing. For instance, the magnetic field may measured directly with probes based on the Hall effect. Such probes yield a voltage that is proportional to the local magnetic field strength. Alternatively the rate of change of the magnetic field strength can be measured by observing the corresponding Faraday induction in small coils. With Faraday probes the field strength is obtained by temporal integration of the output voltage. With Hall and Faraday probes it is difficult to achieve the same accuracy as with MR probes. An advantage of such probes is that they permit measuring the three spatial components of the magnetic field independently, while MR probes measure the magnitude of the magnetic field vector. A further advantage is that such probes are easy to operate in a continuous mode. Based on knowledge of the probe positions, magnetic field data from probes of alternative type (e.g. Hall, Faraday) can be processed in the same way as described further below for MR probes. Likewise, the resulting model of the magnetic field behavior can then be used for improved data processing (e.g. image reconstruction) and sequence correction.

Measuring Probe Positions

In the calibration step 2 in FIG. 1 the probe positions are determined. For MR probes there are several ways of assessing these positions:
a) On MR imaging systems it is straightforward to perform a brief imaging sequence and reconstruct separate MR image data from each probe coil. In each single-probe data set the probe position is then indicated by the intense, strongly localized signal of the probe.
b) The same information can also be obtained with less data acquisition. For each physical gradient channel, a single MR excitation can be performed, switching the gradient to a moderate strength and receiving data with all probes simultaneously. The spectra of the obtained data sets, obtained e.g. by Fourier transform, each exhibit a distinct maximum. The frequencies at which the maxima occur indicate the shift of the respective probe relative to the isocenter in the gradient direction. The probe coordinates in units of length are obtained by dividing the frequency by the gyromagnetic ratio of the probe nucleus and by the gradient strength applied.

c) The probe positions can also be measured by methods other than MR, e.g., with a ruler or with an infrared positioning system.

Mode of Operation

The electronics of the probe coils can be designed for two different modes of operation: receive-only (RO) and transmit-receive (TR). In the RO mode, the coils are used only for signal reception from the samples. In this case another coil is required for transmitting radio frequency (RF) signals for MR excitation in the samples. For instance, this can be done with a volume coil containing all samples, e.g. with a body coil, as available on many MRI systems. This option has the advantage that it may be technically easy to realize on certain system platforms. It has the drawback that RF transmission with a volume coil is usually restricted by power and safety limitations. As a consequence, the RF pulse bandwidth is limited, which limits the flexibility in exciting all samples at a time. In the TR mode, the sample coils are used for both signal reception and RF transmission. This mode is preferred for several reasons. First, it does not require a volume coil tuned to the resonance frequency of the samples. This is important when different nuclei are used for the samples than in the actual experiment. Second, the TR mode permits limiting excitation pulses to the individual samples, hence not interfering with the examined object. This is important when the same nucleus is used for the samples and the actual experiment. Third, due to the small sample volume, little net power is required for driving the sample coils in transmit operation. Therefore it is possible to apply very short RF pulses with high bandwidth, facilitating broadband excitation of the samples without the need to account for individual frequency offsets. TR coils can additionally be shielded against RF penetration. This is particularly useful when the same nucleus is used for the samples and the actual experiment. In this case RF shielding prevents excitation pulses in the main experiment from interfering with the samples and vice versa.

During receive intervals both RO and TR coils are typically operated in the same way as common MR receiver coils. The coil output is amplified, demodulated into a base band and then sampled by an analog-to-digital converter. Optionally, part of the demodulation can be done after digitization.

The samples and the sample containers may be slightly magnetic, i.e. exhibit a non-zero magnetic susceptibility. In this case the magnetic field is slightly enhanced or decreased at the sample positions, resulting in a constant individual offset of the resonance frequency. Preferably, the frequency offsets are assessed in the calibration phase (step 2 in FIG. 1) and accounted for in modeling the magnetic field. The frequency offsets can be assessed by additional MR excitation and signal readout without using any gradient fields during excitation or readout. The p-th sample frequency offset, $\Delta\omega_p$, is the dominant frequency in the p-th sample's calibration signal. It can be determined, e.g., by spectral analysis.

For monitoring an MR imaging or spectroscopy experiment, monitoring signals are acquired from the monitoring probes during execution of the respective experiment. From each MR probe, a monitoring signal is obtained only when and only for as long as the sample yields a resonance signal. Magnetic resonance in the samples is excited by suitable RF transmission prior to a desired monitoring interval. Subsequent to exciting MR samples, monitoring signals are acquired from the samples while the main experiment proceeds independently. The lifetime of individual monitoring signals is limited by relaxation and by the limited homogeneity of the magnetic field inside the samples. Therefore it can be necessary to newly excite magnetic resonance in the samples during the main experiment. A new excitation in a sample typically introduces an interval during which no monitoring information is available from this sample. This problem can be solved by using a redundant set of probes, which still permits fitting a magnetic field model when one or multiple samples yield no signal, e.g., due to re-excitation. Continuous monitoring can then be ensured by suitably interleaving monitoring intervals of the individual samples.

The flexibility in accomplishing continuous monitoring depends on whether probe coils are operated in receive-only (RO) or transmit-receive (TR) mode and whether the same nucleus or different nuclei are used for the samples and the main experiment.

In the RO mode and using the same nucleus as in the main experiment, excitation pulses used in the main experiment can also be used for exciting the probe samples. This is possible when the samples are placed within the volume covered by the transmitting coil. In addition, in the case of selective excitation in the object, the samples must be placed within the selected volume. These limitations can be circumvented by using one or more additional transmit coils and/or additional excitation pulses. In doing so, care must be taken that the additional excitation does not disturb the main experiment.

If RO probes with different nuclei are used, exciting the probes can be accomplished by a separate volume transmit coil or by separate individual transmit coils. Alternatively, the transmission can be done with the same coil as for the main experiment. However, this is possible only if that coil exhibits sufficiently large bandwidth or is tuned to both relevant frequencies. In either case it is possible to excite the probes at any time without interfering with the main experiment. However, interleaved monitoring is not readily feasible with a volume transmit coil that excites all probes at the same time. Interleaved monitoring is readily possible with separate individual transmit coils.

Generally TR probes are preferred because they permit exciting the probes at any time without interfering with the main experiment. Excitation of the probes is preferably performed by RF pulses with high bandwidth. If the bandwidth is sufficiently high, offsets in the probes' resonance frequency due to gradient fields or other field inhomogeneity need not be taken into account. TR probes also permit exciting probes individually and at different times, hence enabling interleaved monitoring as described above.

Processing and Use of Monitoring Data

1. Calculation of the Magnetic Field at the Probe Positions

Demodulation and digitization of a monitoring signal from an MR probe yield a complex-valued signal time-course. The first step in processing such a signal is calculating its phase time-course. Straightforward phase extraction yields the phase only modulo $2\pi$, causing phase-wrapping throughout the time course. Hence the second processing step is phase unwrapping over time, using one of many known unwrapping algorithms. After unwrapping, the phase time course is given by $\phi_{p,\tau}$, where the index p=1, 2, . . . identifies the probe used and the index $\tau$=1, 2, . . . counts the discrete sampling time points. The magnetic field strength at the probe's position and at the sampling time $t_{96}$ is then calculated as $$B_{p,\tau} = \frac{1}{\gamma}\left(\frac{\varphi_{p,\tau} - \varphi_{p,\tau-1}}{\Delta t} - \Delta\omega_p\right) \quad (1)$$

where $\gamma$ denotes the gyromagnetic ratio of the probe substance, $\Delta\tau$ denotes the sampling interval, and $\Delta\omega_p$ denotes the constant frequency offset of probe p obtained at the calibration stage. If no calibration is done, $\Delta\omega_p$ is set to 0.

2. Calculation of a Magnetic Field Model

Different kinds of probes can differ in the information they yield about the local magnetic field. MR probes measure the magnitude of the magnetic field vector. Processing their signal as described above yields the deviation of the field magnitude from $\omega_0/\gamma$, where $\omega_0$ denotes the net demodulation frequency. With other types of probes, such as Faraday and Hall probes, the three spatial components of the magnetic field vector can be resolved. In either case, there are many possible ways of modeling the magnetic field based on the monitoring information. The example procedures described in the following are formulated for a single field variable B, as obtained with MR probes. However, they apply equally to every single component of the magnetic field vector, when available.

The spatially-dependent magnetic field B at a the time point $t_\tau$ can be modeled as a linear combination of $N_m$ model functions $\alpha_m(r)$:

$$B(r, t_\tau) = \sum_{m=1}^{N_m} c_{m,\tau} \alpha_m(r) \quad (2)$$

The model coefficients $C_{m,\tau}$ can then be determined by requiring that the monitoring data fit the model at the probe positions. One suitable fitting criterion is that the sum of the squared deviations between the measured and modeled field strengths be minimal for each time point. This can be accomplished by determining the model coefficients through the matrix equation $$c_\tau = A^+ B_\tau \quad (3)$$

Here, the coefficients for the time point $t_{96}$ were assembled in the column vector $c_\tau=(c_{1,\tau}, c_{2,\tau}, \ldots c_{N_m,\tau})^T$. The field strengths obtained with monitoring were assembled in the column vector $B_\tau=(B_{1,\tau}, B_{2,\tau}, \ldots, B_{N_p,\tau})^T$, $N_P$ denoting the number of probes involved. The matrix A has $N_p$ rows and $N_m$ columns and is defined by $A_{p,m}=\alpha_m(r_p)$. Note that the matrix A varies from time point to time point. The superscript + denotes the Moore-Penrose generalized inverse. In the normal case where the number of probes is at least as large as the number of model functions, Eq. (3) can be spelled out as $$c_\tau = (A^T A)^{-1} A^T B_\tau \quad (4)$$

In an advanced embodiment, the monitoring intervals for the different probes are chosen individually, e.g., for interleaved monitoring with MR probes as described above. Generally, in this case each individual probe yields monitoring signal only for a certain subset of time points. Vice versa, at each time point only a subset of probes yields monitoring signal. In the described modeling approach, only these relevant probes are used for generating the matrix A. That is, the specific probes used for model fitting, as well as their number, $N_P$, can vary from time point to time point. In order for the model to be well-defined throughout a desired span of time, it is crucial that at every time point a sufficient subset of probes yields monitoring signal. If re-excitation of the samples is necessary, this requirement can be met, for instance, by using two full sets of probes in an interleaved fashion. During re-excitation of one probe set, the model is then still well-defined from the monitoring signals from the other set.

3. Uses of Monitoring Data

Raw monitoring data, local field values (Eq. 1), or field models (Eq. 2) can be used to improve the processing of the data acquired from the examined object, both in imaging and spectroscopic experiments. A basic application is described in the following, using the basic model $\alpha_1(r)=1$, $\alpha_2(r)=x$, $\alpha_3(r)=y$, $\alpha_4(r)=z$. The first component of this model is usually intended to be constant in time. Any undesired variation in this component corresponds to a time-varying phase error in the MR signal acquired from the examined object. The phase error can be eliminated using the model coefficients $c_{1,\tau}$:

$$s'(t_\tau) = s(t_\tau)\exp\left(-j\gamma\Delta t \sum_{\tau'=\tau_0}^{\tau} c_{1,\tau'}\right) \quad (5)$$

where j is the imaginary unit, $s(t_\tau)$ denotes the complex signal output of any of the main receivers and $s'(t_\tau)$ denotes the corrected signal for that receiver. The index $\tau_0$ marks the beginning of the time span relevant for the phase evolution, e.g., an excitation pulse in the main experiment.

In MR imaging, the signal encoding with linear gradient fields is usually viewed as a trajectory in k-space, k(t). In the presence of errors in the gradient fields, the actual trajectory deviates from the assumed trajectory, causing artifacts in reconstructed images. Such artifacts can be avoided by accounting for the actual trajectory in image reconstruction. From the basic model, the actual k-space trajectory can be readily calculated. The model coefficients, $c_{2,\tau}$, $c_{3,\tau}$, $c_{4,\tau}$ reflect the actual gradient strengths in the three dimensions x, y, and z. Hence the k-space trajectory is given by $$k(t_\tau) = \gamma\Delta t \sum_{\tau'=\tau_0}^{\tau} \begin{pmatrix} c_{2,\tau'} \\ c_{3,\tau'} \\ c_{4,\tau'} \end{pmatrix} \quad (6)$$

where the index $\tau_0$ again marks the beginning of the relevant time span. For the purpose of clarity it was assumed here and for Eq. (5) that the MR signal from the object detectors is sampled at the same rate as and synchronously with that from the monitoring field probes. When that is not the case, the model coefficients are suitably interpolated in time, e.g., using straightforward linear interpolation.

Raw monitoring data, local field values (Eq. 1), or field models (Eq. 2) can also be used in a feedback mode for determining suitable adjustments of the MR sequence. Typically, the most flexible means of adjusting magnetic fields in an MR apparatus are the gradient coils and potentially shim coils of higher order. However, means of field correction may involve any kind of active or passive magnetic components. For calculating suitable field adjustments it is convenient to use the spatial field patterns, which the available components generate, as model functions in Eq. (2).

Two specific implementations of sequence feedback are proposed. In the first implementation (step 5 in FIG. 1), monitoring data are collected and stored while the sequence is performed, yet without affecting the sequence immediately. Suitable sequence adjustments are then determined (step 7 in FIG. 1) and applied in a subsequent run of the sequence, which is again monitored. By iterating this procedure, the sequence fidelity can be gradually improved until sufficient. In the second implementation (step 6 in FIG. 1), the monitoring data are processed immediately to determine and apply suitable sequence correcadjustioments immediately. In this mode, the monitoring data are not only used for run-time feedback but also stored. They are then available for potential use in data processing or for the first kind of sequence feedback.

The described uses of monitoring data are synergetic and should preferably be combined. With either mode of sequence feedback it is very useful to account for any remaining sequence imperfections at the data processing stage. Furthermore the two feedback mechanisms can be advantageously combined, permitting ex-post refinement of a sequence, for which a first correction was determined already at run-time.

MR Apparatus

The apparatus shown in FIG. 10 is an MR apparatus which comprises a system of four coils 51 for generating a steady, uniform magnetic field whose strength is of the order of magnitude of from some tenths of Tesla to some Tesla. The coils 51, being concentrically arranged relative to the z axis, may be provided on a spherical surface 52. The patient 60 to be examined is arranged on a table 54 which is positioned inside these coils. In order to produce a magnetic field which extends in the z direction and linearly varies in this direction (which field is also referred to hereinafter as the gradient field), four coils 53 as object detectors are provided on the spherical surface 52. Also present are four coils 57 which generate a gradient field which also extends (vertically) in the x direction. A magnetic gradient field extending in the z direction and having a gradient in the y direction (perpendicularly to the plane of the drawing) is generated by four coils 55 which may be identical to the coils 57 but are arranged so as to be offset 90° in space with respect thereto. Only two of these four coils are shown here.

Because each of the three coil systems 53, 55, and 57 for generating the magnetic gradient fields is symmetrically arranged relative to the spherical surface, the field strength at the centre of the sphere is determined exclusively by the steady, uniform magnetic field of the coil 51. Also provided is an RF coil 61 which generates an essentially uniform RF magnetic field which extends perpendicularly to the direction of the steady, uniform magnetic field (i.e. perpendicularly to the z direction). The RF coil receives an RF modulated current from an RF generator during each RF pulse. The RF coil 61 can also be used for receiving the spin resonance signals generated in the examination zone.

As is shown in FIG. 11, MR signals received the object detectors 81 are amplified and demodulated transposed into the base band by unit 70. The analog signals thus obtained are converted into sequences of digital values by analog-to-digital converters 71. The analog-to-digital converters 71 isare controlled by a control unit 69 so that they generate digital data words only during read-out phases. The analog-to-digital converters 71 isare succeeded by Fourier transformation units 72 which perform one-dimensional Fourier transformations over the sequences of signal samplesing, execution being so fast that the Fourier transformation is terminated before the next MR signal is received.

The raw data thus produced by Fourier transformation is written into a memory 73 whose storage capacity suffices for the storage of several sets of raw data. From these sets of raw data a composition unit 74 generates a composite image in the described manner; this composite image is stored in a memory 75 whose storage capacity suffices for the storage of a large number of successive composite images 80. These sets of data are calculated for different instants, the spacing of which is preferably small in comparison with the measurement period required for the acquisition of a set of data. A reconstruction unit 76, performing a composition of the successive images, produces MR images from the sets of data thus acquired, said MR images being stored. The MR images represent the examination zone at the predetermined instants. The series of the MR images thus obtained from the data suitably reproduces the dynamic processes in the examination zone.

The units 70 to 76 are controlled by the control unit 69. As denoted by the downwards pointing arrows, the control unit also imposes the variation in time of the currents in the gradient coil systems 53, 55 and 57 as well as the central frequency, the bandwidth and the envelope of the RF pulses generated by the RF coil 61. The memories 73 and 75 as well as the MR image memory (not shown) in the reconstruction unit 76 can be realized by way of a single memory of adequate capacity. The Fourier transformation unit 72, the composition unit 74 and the re-construction unit 76 can be realized by way of a data processor well-suited for running a computer program according the above mentioned method.

Chains of amplification and demodulation units 82 and digitization units 83 are also provided for receiving signals from field monitoring probes 84. The digitized monitoring data are fed into the control unit 69 for processing. Based on the monitoring results, the control unit 69 adjusts its outputs.

What is claimed is:

1. A magnetic resonance (MR) imaging or spectroscopy method in which a main magnetic field is generated in an object by a main magnet and superimposed magnetic fields and radiofrequency fields are generated according to an MR sequence for forming images or spectra, wherein object signals are acquired from the object with at least one object detector during execution of the MR sequence, additional data are acquired from at least four monitoring field probes positioned in the vicinity of and surrounding the object, during execution of the MR sequence, the additional data from the at least four monitoring field probes are used for adjusting the MR sequence such as to account for imperfections in the magnetic field behavior in the object, and/or the additional data from the at least four monitoring field probes are used in conjunction with the object signals for reconstruction of the images or spectra.

2. Magnetic resonance method according to claim 1, wherein the positions and/or local field offsets of the monitoring field probes are determined.

3. Magnetic resonance method according to claim 1, wherein the MR sequence is adjusted based on a model of the spatial and temporal behavior of the magnetic field, which model is calculated from the additional data obtained from the monitoring field probes.

4. Magnetic resonance method according to claim 2, wherein the MR sequence is adjusted based on a model of the spatial and temporal behavior of the magnetic field, which model is calculated from the additional data obtained from the monitoring field probes.

5. Magnetic resonance method according to claim 3, wherein the model of the behavior of the magnetic field is used to adjust the MR sequence for a subsequent execution of the sequence.

6. Magnetic resonance method according to claim 4, wherein the model of the behavior of the magnetic field is used to adjust the MR sequence for a subsequent execution of the sequence.

7. Magnetic resonance method according to claim 3, wherein the model of the behavior of the magnetic field is used to adjust the MR sequence while running.

8. Magnetic resonance method according to claim 1, wherein the monitoring field probes are operated individually or in groups in a temporally interleaved pattern.

9. Magnetic resonance method according to claim 1, wherein the coherence of the transverse magnetization in the monitoring field probes is actively destroyed prior to excitation.

10. A magnetic resonance apparatus comprising:
a main magnetic field magnet
gradient coils for generating gradient magnetic fields superimposed to the main magnetic field,
at least one object detector for acquiring a plurality of object signals from the object to be examined,
at least four monitoring field probes positioned in the vicinity of and surrounding the object to be examined,
means for calculating a model of the magnetic field behavior in the object from data from the at least four monitoring field probes, and
means for reconstructing images or spectra from the additional data from the at least four monitoring field probes in conjunction with the object signals.

11. Magnetic resonance apparatus according to claim 10, wherein the monitoring field probes comprise a sample of a magnetic resonance active substance and an MR detector for receiving monitoring data from the sample.

12. Magnetic resonance apparatus according to claim 11, wherein the MR detector comprises a single loop coil.

13. Magnetic resonance apparatus according to claim 12, wherein the MR detector comprises an additional single loop coil with an opposite winding sense which is electrically connected to the first single loop coil for canceling long-range sensitivity.

14. Magnetic resonance apparatus according to claim 11, wherein the MR detector comprises a double loop coil electrically connected to two single loop coils with opposite winding sense at opposite sides of the double loop coil for canceling long-range sensitivity.

15. Magnetic resonance apparatus according to claim 11, wherein the MR detector comprises a solenoid coil.

16. Magnetic resonance apparatus according to claim 14, wherein the MR detector further comprises an additional solenoid coil with opposite winding sense for canceling long-range sensitivity.

17. Magnetic resonance apparatus according to claim 11, wherein the MR detector further comprises two additional solenoid coils with opposite winding sense at opposite sides electrically connected to the solenoid coil for canceling long-range sensitivity.

18. Magnetic resonance apparatus according to claim 11, wherein the sample detector comprises a toroid coil.

19. Magnetic resonance apparatus according to claim 11, wherein the MR active substance is based on a different nucleus than the nuclei used in the actual MR experiment.

20. Magnetic resonance apparatus according to claim 19, wherein the nucleus used for the active substance is $^1$H or $^{19}$F.

21. Magnetic resonance apparatus according to claim 20, wherein the active substance comprises water, hexafluorobenzene or trifluoromethylsulfonate.

22. Magnetic resonance apparatus according to claim 19, wherein the sample substance contains a relaxation.

23. A computer program product stored on a computer usable medium for forming a dynamic image by means of the magnetic resonance method, comprising a computer readable program means for causing the computer to control the execution of:
acquiring additional data from at least four monitoring field probes positioned in the vicinity of and surrounding the object to be examined, during execution of the MR sequence,
using the additional data from the at least four monitoring field probes for adjusting the MR sequence such as to correct for imperfections of the spatial and temporal behavior of the magnetic field in the object, and
using the additional data from the at least four monitoring field probes in conjunction with the object signals for reconstruction of images or spectra.

24. Computer program product according to claim 23, further comprising adjusting the MR sequence based on a model of the spatial and temporal behavior of the magnetic field, which model is calculated from the additional data obtained from the monitoring field probes.

25. Computer program product according to claim 24, further comprising using the model of the behavior of the magnetic field to adjust the MR sequence for a subsequent execution of the MR sequence.

26. Computer program product according to claim 24, further comprising using the model of the behavior of the main magnetic field to adjust the MR sequence while running.

27. Computer program product according to claim 23, further comprising operating the monitoring field probes individually in a temporally interleaved pattern.

* * * * *

UNITED STATES PATENT AND TRADEMARK OFFICE
CERTIFICATE OF CORRECTION

PATENT NO. : 7,208,951 B2
APPLICATION NO. : 11/095295
DATED : April 24, 2007
INVENTOR(S) : Klaas P. Pruessmann et al.

It is certified that error appears in the above-identified patent and that said Letters Patent is hereby corrected as shown below:

Column 14, Claim 22, line 22, please insert the word --agent-- after the word "relaxation".

Signed and Sealed this

Third Day of July, 2007

JON W. DUDAS
*Director of the United States Patent and Trademark Office*